United States Patent
Zhang et al.

(10) Patent No.: US 12,242,298 B2
(45) Date of Patent: Mar. 4, 2025

(54) REGISTER CLOCK DRIVER WITH CHIP SELECT LOOPBACK

(71) Applicant: Renesas Electronics America Inc., Milpitas, CA (US)

(72) Inventors: Zhihan Zhang, Shanghai (CN); Yuan Zhang, Shanghai (CN)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 18/523,438

(22) Filed: Nov. 29, 2023

(65) Prior Publication Data
US 2024/0094762 A1    Mar. 21, 2024

Related U.S. Application Data (63) Continuation of application No. 17/566,926, filed on Dec. 31, 2021, now Pat. No. 11,868,172, which is a
(Continued)

(51) Int. Cl.
| | | |
|---|---|---|
| G06F 12/00 | (2006.01) | |
| G06F 1/06 | (2006.01) | |
| G06F 1/10 | (2006.01) | |
| G06F 1/12 | (2006.01) | |
| G11C 7/22 | (2006.01) | |
| G11C 7/24 | (2006.01) | |

(52) U.S. Cl.
CPC .............. G06F 1/06 (2013.01); G06F 1/10 (2013.01); G06F 1/12 (2013.01); G11C 7/22 (2013.01); G11C 7/24 (2013.01)

(58) Field of Classification Search
CPC ..... G06F 1/06; G06F 1/10; G06F 1/12; G11C 7/22; G11C 7/24
USPC ........................................................ 711/154
See application file for complete search history.

(56) References Cited

U.S. PATENT DOCUMENTS

| | | | | |
|---|---|---|---|---|
| 7,761,725 | B2 * | 7/2010 | Boskovic ................. | G11C 5/00 |
| | | | | 713/600 |
| 8,028,144 | B2 * | 9/2011 | Hampel .............. | G06F 13/1663 |
| | | | | 711/149 |
| 8,972,685 | B2 * | 3/2015 | Bains ....................... | G11C 7/22 |
| | | | | 711/167 |

(Continued)

FOREIGN PATENT DOCUMENTS

| | | |
|---|---|---|
| KR | 20160090950 A | 8/2016 |
| KR | 20200043017 A | 4/2020 |

OTHER PUBLICATIONS

KR Office Action dated Oct. 21, 2024 issued in KR Application No. 10-2022-7042791.

*Primary Examiner* — Viet Q Nguyen
(74) *Attorney, Agent, or Firm* — SCULLY, SCOTT, MURPHY & PRESSER, P.C.

(57) ABSTRACT

In an embodiment, an apparatus an apparatus including a memory module is described. The memory module can include a plurality of memory ranks and a register clock driver (RCD) coupled to the plurality of memory ranks. The RCD can include a receiver configured to receive a chip select signal for selecting one or more memory ranks. The RCD can further include a logic circuit coupled to the receiver, and an output driver coupled to the logic circuit. The RCD can further include a loopback circuit configured to sample the chip select signal from one or more of a first sampling point between the receiver and the logic circuit and a second sampling point between the logic circuit and the output driver.

5 Claims, 6 Drawing Sheets

Related U.S. Application Data continuation of application No. PCT/CN2021/130922, filed on Nov. 16, 2021.

(56) References Cited

U.S. PATENT DOCUMENTS

| | | | | |
|---|---|---|---|---|
| 9,087,568 | B1 * | 7/2015 | Ware | G11C 11/4076 |
| 9,128,632 | B2 * | 9/2015 | Lee | G11C 29/023 |
| 10,014,860 | B2 * | 7/2018 | Shaeffer | G11C 11/4063 |
| 10,437,279 | B2 * | 10/2019 | Chang | G06F 1/10 |
| 10,530,347 | B2 * | 1/2020 | Tang | G11C 7/1093 |
| 10,635,628 | B2 * | 4/2020 | Jue | G06F 13/4243 |
| 10,650,872 | B2 * | 5/2020 | Ware | G06F 13/1647 |
| 11,061,590 | B2 * | 7/2021 | Morris | G11C 29/028 |
| 11,073,861 | B2 * | 7/2021 | Bezzam | H03K 19/21 |
| 11,294,830 | B2 * | 4/2022 | Yeung | G06F 13/16 |
| 11,467,986 | B2 * | 10/2022 | Hampel | G06F 13/28 |
| 11,705,917 | B2 * | 7/2023 | Jefremow | G01R 31/31709 341/122 |
| 11,868,172 | B2 * | 1/2024 | Zhang | G06F 1/06 |
| 2019/0042519 | A1 | 2/2019 | Jue et al. | |
| 2019/0205268 | A1 * | 7/2019 | Hampel | H05K 1/181 |
| 2022/0199132 | A1 * | 6/2022 | Partsch | G11C 7/222 |

* cited by examiner

REGISTER CLOCK DRIVER WITH CHIP SELECT LOOPBACK

CROSS-REFERENCE TO RELATED APPLICATIONS

This application is a continuation of U.S. patent application Ser. No. 17/566,926, filed on Dec. 31, 2021, which is a continuation of PCT International Application No. PCT/CN2021/130922, filed on Nov. 16, 2021. The entire contents of U.S. patent application Ser. No. 17/566,926 and PCT International Application No. PCT/CN2021/130922 are incorporated by reference herein.

BACKGROUND OF THE SPECIFICATION

The present disclosure relates to memory devices. More specifically, the present disclosure relates in some embodiments to register clock drivers of a double data-rate (DDR) random access memory (RAM) module.

Power consumption and efficiency is increasingly important in both fixed and portable computing devices to reduce power costs and ensure a long battery life. Portable computing devices, such as, e.g., laptops, notebooks, netbooks, or other computing devices that may need to rely on battery power, often have stringent requirements for power consumption and efficiency. In such computing devices, each component typically needs to be optimized to reduce power consumption. In an aspect, double data rate fifth generation (DDR5) memory modules can be used in these computing devices. When compared to its predecessors (e.g., DDR3 and DDR4 memory modules), DDR5 memory modules have reduced power consumption, improved bandwidth, and improved efficiency (e.g., faster). In an aspect, DDR5 memory modules can incorporate on-board voltage regulators in order to reach higher speeds.

SUMMARY

In an embodiment, an apparatus in a memory module is generally described. The apparatus can include a receiver configured to receive a chip select signal for selecting one or more memory ranks of the memory module. The apparatus can further include a logic circuit coupled to the receiver. The apparatus can further include an output driver coupled to the logic circuit. The logic circuit can be configured to decode the chip select signal to generate an output signal for selecting the one or more memory ranks of the memory module. The output driver can be configured to select the one or more memory ranks using the output signal. The apparatus can further include a loopback circuit configured to sample the chip select signal from one or more of a first sampling point between the receiver and the logic circuit and a second sampling point between the logic circuit and the output driver.

In another embodiment, an apparatus comprising a memory module is generally described. The memory module can include a plurality of memory ranks and a register clock driver (RCD). The RCD can be coupled to the plurality of memory ranks. The RCD can include a receiver configured to receive a chip select signal for selecting one or more memory ranks among the plurality of memory ranks. The RCD can further include a logic circuit coupled to the receiver. The RCD can further include an output driver coupled to the logic circuit. The logic circuit can be configured to decode the chip select signal to generate an output signal for selecting the one or more memory ranks of the memory module. The output driver can be configured to select the one or more memory ranks using the output signal. The RCD can further include a loopback circuit configured to sample the chip select signal from one or more of a first sampling point between the receiver and the logic circuit and a second sampling point between the logic circuit and the output driver.

In another embodiment, a method for operating a memory module is generally described. The method can include receiving, by a register clock driver (RCD) of a memory module, a chip select signal for selecting one or more memory ranks of the memory module. The method can include sampling, by the RCD, the chip select signal from one or more of a first sampling point between a receiver of the RCD and a logic circuit of the RCD and a second sampling point between the logic circuit of the RCD and an output driver of the RCD.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

A register clock driver (RCD) is a device is used on a memory module, such as DDR5 memory modules. The RCD can buffer the command address (CA) bus, chip select signals, and clock signals between a host controller and the DDR5 memory module. When RCD is used on a load-reduction dual in-line memory module (LRDIMM), the RCD can also create a buffer communications (BCOM) bus to control the data buffers of LRDIMM. LRDIMM can support relatively higher densities than other memory modules, and includes a memory buffer chip. In an aspect, LRDIMM can be used in, for example, servers, and the memory buffer chip of the LRDIMM can reduce and minimize the load on the server's memory bus. For example, the LRDIMM can use the memory buffer chip to consolidate the electrical loads of the ranks on the LRDIMM to a single electrical load, allowing them to have up to, for example, eight ranks on a single DIMM module. Thus, using LRDIMMs can allow systems to be configured with the largest possible memory footprints.

However, LRDIMM usage of the memory buffer chip, instead of registers like other DIMMs, can penalize signal integrity, especially as the speed of DDR5 memory modules increases (e.g., the higher the speed, the poorer the signal integrity). In one example, the disclosed embodiments may integrate a loopback or feedback circuit having hardware components to form feedback paths for chip select signals of a RCD. The feedback paths can drive the chip select signals of the RCD back to a host controller for debugging, testing, or training. Further, in one embodiment, the feedback path for the chip select signals can utilize a portion of other existing feedback paths reserved for other internal signals of the RCD that may be fed back to the host controller. Furthermore, the feedback circuit integrated in the RCD can sample chip select signals from different locations within the RCD such that the host controller can determine which component or processing stage of the RCD may be causing problems. Still further, integrating the feedback circuit in the RCD allows the RCD to undergo testing of chip select signals at any time, including during normal operations of the memory module. By being able to test the chip select signals any time, signal integrity of the chip select signals may be maintained to improve functionality of the memory module.

Figure 1:
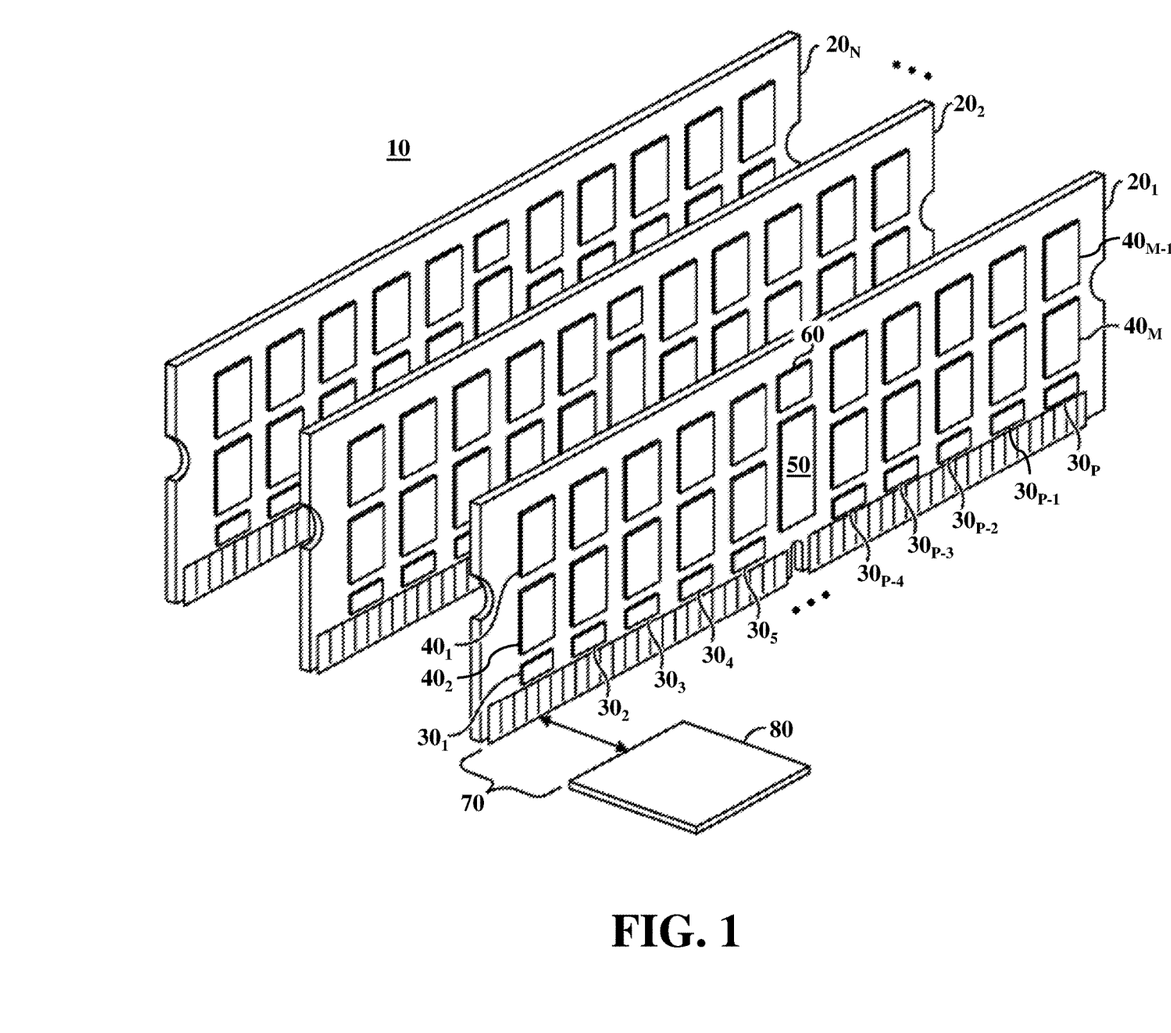
FIG. 1 is a diagram of an example memory system according to an embodiment of the disclosure.
Figure 2:
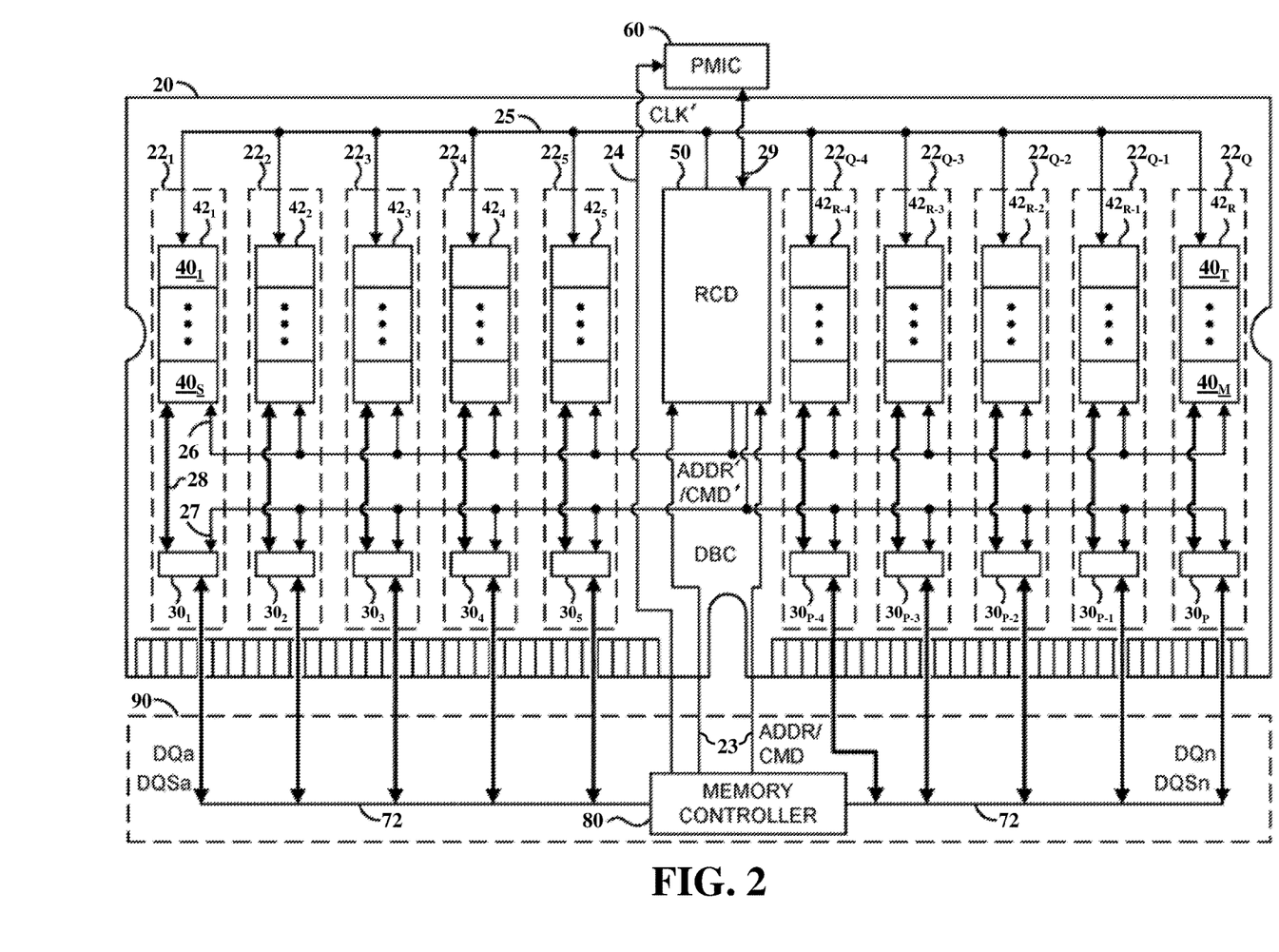
FIG. 2 is a block diagram illustrating an example memory module of the memory system of FIG. 1 according to an embodiment of the disclosure.

FIGS. 1 and 2 illustrate an example embodiment of a memory system 10. The memory system 10 includes memory modules $20_1$, $20_2$ ... $20_N$, also referred to herein collectively or individually as memory module(s) 20, connectors 70 and a memory controller 80.

With reference to FIG. 1, in one example embodiment, the memory modules 20 may comprise dual in-line memory modules (DIMMs). In some embodiments, the memory modules 20 may be implemented as double data rate fifth generation (DDR5) SDRAM modules. While described and illustrated herein as having a particular type, arrangement and number of components, in other embodiments, memory modules 20 may comprise any other type, arrangement or number of components.

An example memory module 20 comprises circuitry blocks $30_1$, $30_2$, $30_3$, $30_4$, $30_5$ ... $30_{P-4}$, $30_{P-3}$, $30_{P-2}$, $30_{P-1}$ and $30_P$, circuitry blocks $40_1$, $40_2$, ... $40_{M-1}$ and $40_M$, a registered clock driver (RCD) 50, a PMIC 60, connectors 70 and any other blocks, circuits, pins, connectors, traces or other component typically found in a memory module. In some embodiments, circuitry blocks $30_1$, $30_2$, $30_3$, $30_4$, $30_5$ ... $30_{P-4}$, $30_{P-3}$, $30_{P-2}$, $30_{P-1}$ and $30_P$ may be configured as data buffers and will also be referred to herein collectively or individually as data buffers(s) 30. In some embodiments, circuitry blocks $40_1$, $40_2$, ... $40_{M-1}$ and $40_M$ may be configured as memory devices and will also be referred to herein collectively or individually as memory device(s) 40. While described herein as data buffers 30 and memory devices 40, circuitry blocks 30 and 40 may also or alternatively be utilized for any other purpose by the memory modules 20.

In some embodiments, data buffers 30 and memory devices 40 comprise synchronous dynamic random-access memory (SDRAM) devices, chips or modules. In some embodiments, data buffers 30 and memory devices 40 also or alternatively comprise any other types of memory devices such as, e.g., SRAM, DRAM, MROM, PROM, EPROM and EEPROM. The data buffers 30, memory devices 40 or both may be physically located on one side or both sides (e.g., the front and back) of the memory module 20.

PMIC 60 is configured to perform power management for the memory module 20. For example, the PMIC 60 may be configured to scale up or scale down voltages, perform DC-DC conversions or perform other similar power management operations. In some embodiments, PMIC 60 may comprise low-dropout regulators (LDOs), DC-DC converters such as, e.g., buck or boost converters, pulse-frequency modulation (PFM), pulse-width modulation (PWM), power field-effect transistors (FETs), real-time clocks (RTCs) or any other circuitry that may typically be found in a PMIC.

Connectors 70 may comprise, for example, pins, traces or other connections that are configured to connect the memory modules 20 to other components of a computing system such as, e.g., a memory controller 80, motherboard, or other components. In some embodiments, the connectors 70 may comprise, e.g., a 288-pin configuration or any other pin configuration.

In some embodiments, the memory module 20 comprises the connectors 70. In other embodiments, a motherboard, memory controller 80 or any other component of a computing device comprises the connectors 70. In another embodiment, one or more of the connectors 70 may be part of the memory module 20 and one or more of the connectors 70 may be part of the motherboard, memory controller 80 or other component of the computing device.

The memory modules 20 may be connected to the motherboard, memory controller 80 or other component of a computing device, e.g., by connectors 70, to transfer data between components of the computing device and the memory modules 20. For example, in an embodiment that implements a UDIMM, the connectors 70 may comprise a 64-bit bus, a 72-bit bus or a bus comprising any other number of bits.

The memory modules 20 are shown connected to the memory controller 80 of the computing device. In an example embodiment, the memory controller 80 may be implemented as a component of a computer motherboard, or main board, of the computing device, e.g., on a northbridge of the motherboard. In another example, the memory controller 80 may be implemented as a component of a microprocessor of the computing device. In yet another example, the memory controller 80 may be implemented as a component of a central processing unit (CPU) of the computing device. In other embodiments, the memory controller 80 may be implemented as a part of any other component of the computing device.

In some embodiments, the memory modules 20 are implemented as DDR5 SDRAM memory modules. As an example, the memory modules 20 may comprise a memory module density of 128 gigabyte (GB), 512 GB, one terabyte (TB), or higher per module. Memory modules 20 may operate with a frequency of about 1.2 to about 3.2 giga-Hertz (GHz) and a data rate range of about 3.2 GT/s to about 4.6 GT/s and in some cases a data rate up to about 8 GT/s or more. In some embodiments, the memory modules 20 may alternatively comprise smaller or larger densities, operate at lower or higher frequencies and operate at lower or higher data rates.

With reference now to FIG. 2, a block diagram illustrating an example memory module 20 of FIG. 1 is shown. The memory module 20 may be representative of the memory modules 20A-20N. The memory module 20 is shown communicating with the memory controller 80. The memory controller 80 is shown as part of a circuit 90 such as, e.g., a motherboard, main board or other component of a computing device that communicates with the memory module 20.

The memory module 20 comprises one or more groupings of circuits $22_1$, $22_2$, $22_3$, $22_4$, $22_5$ ... $24_{Q-4}$, $24_{Q-3}$, $24_{Q-2}$, $24_{Q-1}$ and $22_Q$, also referred to herein collectively or individually as data paths 22 of the memory module 20. In the example shown, the memory module 20 may comprise five data paths 22, e.g., data paths $22_1$, $22_2$, $22_3$, $22_4$ and $22_5$, on one side of the RCD 50 and five data paths 22, e.g., data paths $22_{Q-4}$, $22_{Q-3}$, $22_{Q-2}$, $22_{Q-1}$ and $22_Q$, on the other side of the RCD 50. In other embodiments, memory module 20 may comprise other arrangements having a greater or smaller number of data paths 22 on each side of the RCD 50.

The data paths 22 may each comprise a respective memory channel $42_1$, $42_2$, $42_3$, $42_4$, $42_5$ . . . $42_{R-4}$, $42_{R-3}$, $42_{R-2}$, $42_{R-1}$ and $42_R$, also referred to herein collectively and individually as memory channel(s) 42. Each memory channel 42 may comprise one or more of the memory devices 40. For example, memory channel $42_1$ may comprise memory devices $40_1$ through $40_S$, while memory channel $42_R$ may comprise memory devices $40_T$ through $40_M$.

The memory controller 80 is configured to generate a variety of signals including a clock signal (CLK), control signals (ADDR and CMD) and command signals. One or more of the CLK, ADDR and CMD signals may be provided to the RCD 50, e.g., via one or more buses 23.

Signals from the memory controller 80 may also be transmitted from the memory controller 80 to the PMIC 60 via a bus 24, also referred to herein as a host interface bus 24. In some embodiments, host interface bus 24 is bi-directional and is configured to communicate commands or other data between PMIC 60 and memory controller 80 or other components of the memory module 20. The host interface bus 24 may implement an I²C protocol, an I³C protocol or any other protocol.

A data bus 72 may be connected between the memory controller 80 and the data paths 22, e.g., with data buffers 30, and may comprise connectors 70, e.g., traces, pins and other connections, between the memory controller 80 and the data paths 22.

The memory controller 80 may generate or receive data signals, e.g., DQa-DQn, and data strobe signals, e.g., DQSa-DQSn, that may be presented to or received from the data bus 72. Portions of the signals DQa-DQn and DQSa-DQSn may be presented to or received from respective data paths 22. In the example shown, each of the signals DQa-DQn may have a corresponding signal DQSa-DQSn. In some embodiments, one DQS signal may strobe multiple DQ signals, e.g., one DQS signal for four DQ signals in some embodiments.

The RCD 50 is configured to communicate with the memory controller 80, the data buffers 30, the memory channels 42 and the PMIC 60. The RCD 50 is configured to decode instructions, e.g., control words, received from the memory controller 80. For example, the RCD 50 may be configured to receive and decode register command words (RCWs). In another example, the RCD 50 may be configured to receive and decode buffer control words (BCWs). The RCD 50 is configured to train one or more of the data buffers 30, memory devices 40 and the command and address lines between the RCD 50 and the memory controller 80. For example, the RCWs may flow from the memory controller 80 to the RCD 50 and be used to configure the RCD 50.

In some embodiments, the RCD 50 may implement a command/address register, e.g., a 32-bit 1:2 command/address register. The RCD 50 may support an at-speed bus, e.g., a unidirectional buffer communications (BCOM) bus between the RCD 50 and the data buffers 30. In some embodiments, the RCD 50 may implement one or more of automatic impedance calibration, command/address parity checking, control register RCW readback, a serial bus such as, e.g., a 1 MHz inter-integrated circuit (I²C) bus, and a 12.5 MHz inter-integrated circuit (I³C) bus. Inputs to the RCD 50 may be pseudo-differential using one or more of external and internal voltages. The clock outputs, command/address outputs, control outputs and data buffer control outputs of the RCD 50 may be enabled in groups and independently driven with different strengths.

The RCD 50 is configured to receive the CLK, ADDR and CMD signals or other signals such as, e.g., RCWs and BCWs, from the memory controller 80 and to utilize various digital logic components to generate corresponding output signals based on the CLK, ADDR and CMD signals. For example, the RCD 50 is configured to generate corresponding signals such as, e.g., CLK', ADDR' and CMD' signals based on the received CLK, ADDR and CMD signals. The CLK', ADDR' and CMD' signals may be presented to the memory channels 42. For example, the CLK' signals may be transmitted from the RCD 50 to the memory channels 42 on a common bus 25 and the ADDR' and CMD' signals may be transmitted from the RCD 50 to the memory channels 42 on a common bus 26. The RCD 50 is also configured to generate one or more data buffer control (DBC) signals that are transmitted to the data buffers 30, for example, on a common bus 27, also referred to herein as a data buffer control bus 27.

The data buffers 30 are configured to receive commands and data from the data buffer control bus 27 and to generate data, receive data or transmit data to and from the data bus 72. Each data path 22 also comprises bus 28 between its data buffer 30 and memory channel 42 that is configured to carry the data between the data buffer 30 and memory channel 42. For example, as seen in FIG. 2, data path $22_1$ comprises a bus 28 between data buffer $30_1$ and memory channel $42_1$.

The data buffers 30 are configured to buffer data on the buses 72 and 28 for write operations, e.g., data transfers from the memory controller 80 to the corresponding memory channels 42, and read operations, e.g., data transfers from the corresponding memory channels 42 to the memory controller 80.

In some example embodiments, the data buffers 30 exchange data with the memory devices 40 via the buses 28 in small units, e.g., 4-bit nibbles. In other embodiments, larger or smaller sizes of data transfer may alternatively be utilized. In some cases, the memory devices 40 may be arranged into multiple sets, e.g., two sets. For example, for a two set/two memory device implementation, e.g., memory devices $40_1$ and $40_2$, each set may contain a single memory device 40, e.g., $40_1$ or $40_2$) with each memory device 40 being connected to the respective data buffers 30 through an upper nibble and a lower nibble. For two set/four memory device implementation, each set may contain two memory devices 40. The first set may be connected to the respective data buffers 30 through the upper nibble and the second set may be connected to the respective data buffers 30 through the lower nibble. For two set/eight memory device implementation, each set may contain four of the memory devices 40. The first set of four memory devices 40 may connect to the respective data buffers 30 through the upper nibble and the second set of four memory devices may connect to the respective data buffers 30 through the lower nibble. Other numbers of sets, other numbers of memory devices per set and other data unit sizes may alternatively be utilized.

Memory module 20 may also comprise an interface 29 that is configured to enable communication between the RCD 50 and the PMIC 60. For example, the interface 29 may utilized as part of a register clock driver/power management integrated circuit interface, e.g., an RCD-PMIC interface. The interface 29 is configured to support one or more signals or connections that may be bidirectional or unidirectional.

Figure 3:
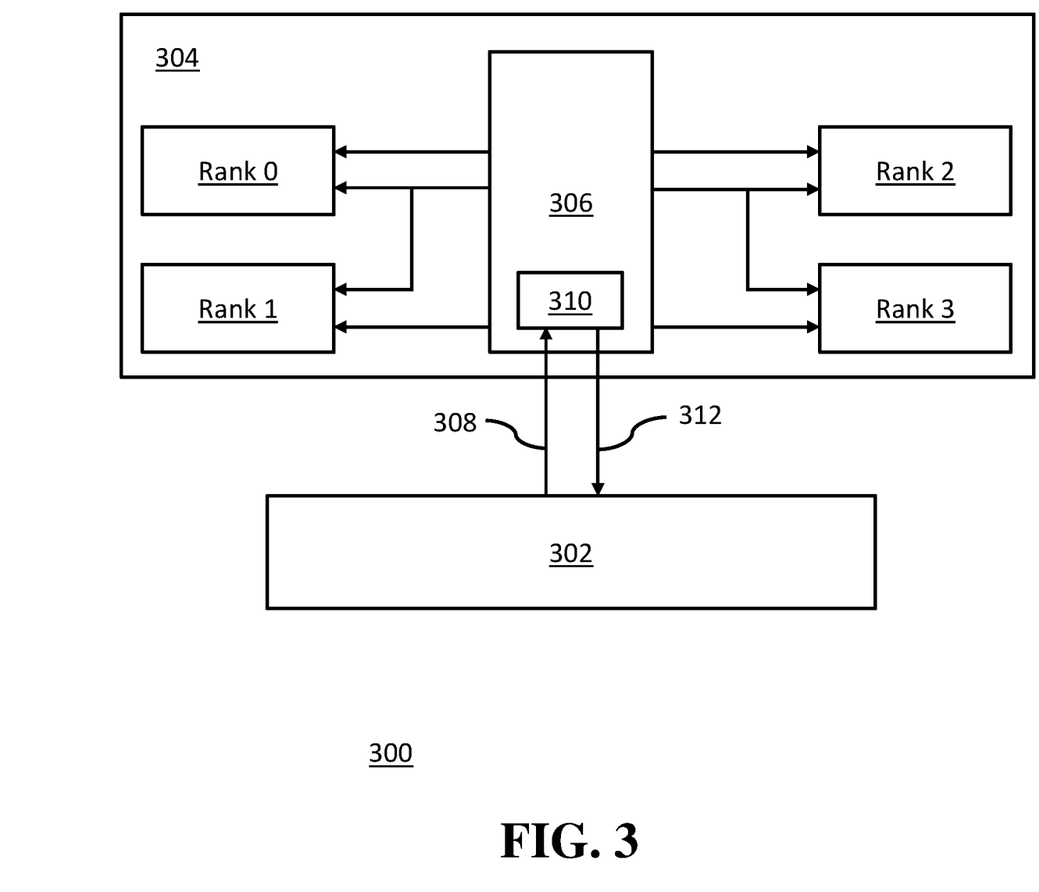
FIG. 3 is a block diagram of an example memory module including a register clock driver with a chip select loopback circuit according to an embodiment of the disclosure.

FIG. 3 is a block diagram of an example 300 that can implement a register clock driver with a chip select loopback circuit according to an embodiment of the disclosure. The system 300 can include a host device 302 and a memory module 304. The memory module 304 can be one of the memory modules 20, and the host device 302 can be the memory controller 80 shown in FIG. 1 and FIG. 2. In one or more embodiments, the host device 302 can be, for example, a part of a circuit, a motherboard, a main board, a processor or processor core, a central processing unit (CPU), or other component of a computing device that communicates with the memory module 304. The system 300 can be implemented in a computing device such as a desktop computer, a laptop computer, a server, a benchmark testing device, etc. In an embodiment, the memory module 304 can be, for example, a dual in-line memory modules (DIMMs). In some embodiments, the memory module 304 may be implemented as a double data rate fifth generation (DDR5) load-reduction dual in-line memory module (LRDIMM) including synchronous dynamic random-access memory (SDRAM) devices.

The memory module 304 can include a register clock driver (RCD) 306 and a plurality of memory ranks. In the example shown in FIG. 3, the memory module 304 can include four memory ranks labeled as Rank 0, Rank 1, Rank 2, Rank 3. In one or more embodiments, the memory module 304 may include less than four ranks, or more than four ranks up to, for example, eight ranks. In some embodiments, the RCD 306 may implement a command/address register, and may support a unidirectional buffer communications (BCOM) bus between the RCD 306 and data buffers in the memory module 304.

The RCD 306 may be configured to receive a plurality of input signals 308 from the host device 302. The input signals 308 can include control signals such as address signals (e.g., bank address signals, row address signals, column address signals, gated column address strobe signals, chip-select signals, parity signals), and command signals (e.g., refresh, pre-charge, etc.), and data signals (e.g., data to be written to the memory devices among the memory module 304).

The RCD 306 can be configured to operate in loopback and pass-through modes. The pass-through mode allows the RCD 306 to decode the input signals 308 and proceed to read and/or write to the memory ranks of the memory module 304 based on the input signals 308. In one embodiment, the RCD 306 can include one or more logic circuit configured to receive the input signals 308 and generate a set of output control signals that can be transmitted to appropriate memory devices among the memory module 304. Further, the RCD 306 may be configured to decode instructions from the input signals 308. For example, the RCD 306 may be configured to receive and decode register command words (RCWs) and buffer control words (BCWs) received from the host device 302. The pass-through mode allows input signals 308 to be processed by the logic circuit of the RCD 306 and output to one or more memory ranks among the memory module 304.

The loopback mode allows the RCD 306 to feed back samples of one or more signals among the input signals 308, or among other internal signals in the RCD 306 (e.g., signals being exchanged between components within RCD 306), to the host device 302, or another device, for testing, debugging and training purposes. In one embodiment, the loopback mode of the RCD 306 can be activated by enabling a loopback circuit 310 in the RCD 306. The loopback circuit 310 may be configured to sample signals among the input signals 308 or internal signals of the RCD 306, and transmit the sampled signals to the host device 302. In one or more embodiments, the pass-through mode and the loopback mode can be activated individually or simultaneously.

In as aspect, sampling external signals (e.g., signals provided to the RCD 306 by another device outside of RCD 306, or provided by the RCD 306 to another device), and sampling output signals of the RCD 306, can allow the host device 302 to determine whether errors are present or absent within the RCD 306. However, such sampling techniques may not allow the host device 302 to determine which part, or processing stage, or component, of the RCD 306 caused the errors. The integration of the loopback circuit 310 in the RCD 306 can allow the loopback circuit 310 to sample internal signals in the RCD 306 from one or more sampling points within the RCD 306. The sampled signals from the one or more sampling points inside the RCD 306 can allow the host device 302 to identify specific processing stage or component in the RCD 306 that may be causing errors. In one embodiment, a chip select signal among the input signals 308 can be sampled at multiple sampling points in the RCD 306 to determine whether any error relating to the chip select signal is present or not (e.g., the chip select signal being incorrect, or undesirable delays, etc.) in response to being processed by different processing stages in the RCD 306. In another embodiment, the loopback circuit 310 may use existing internal loopback lines in the RCD 306 for sampling the chip select signals in order to reduce the number of hardware or traces that may be used for integrating the chip select signal loopback feature.

Figure 4:
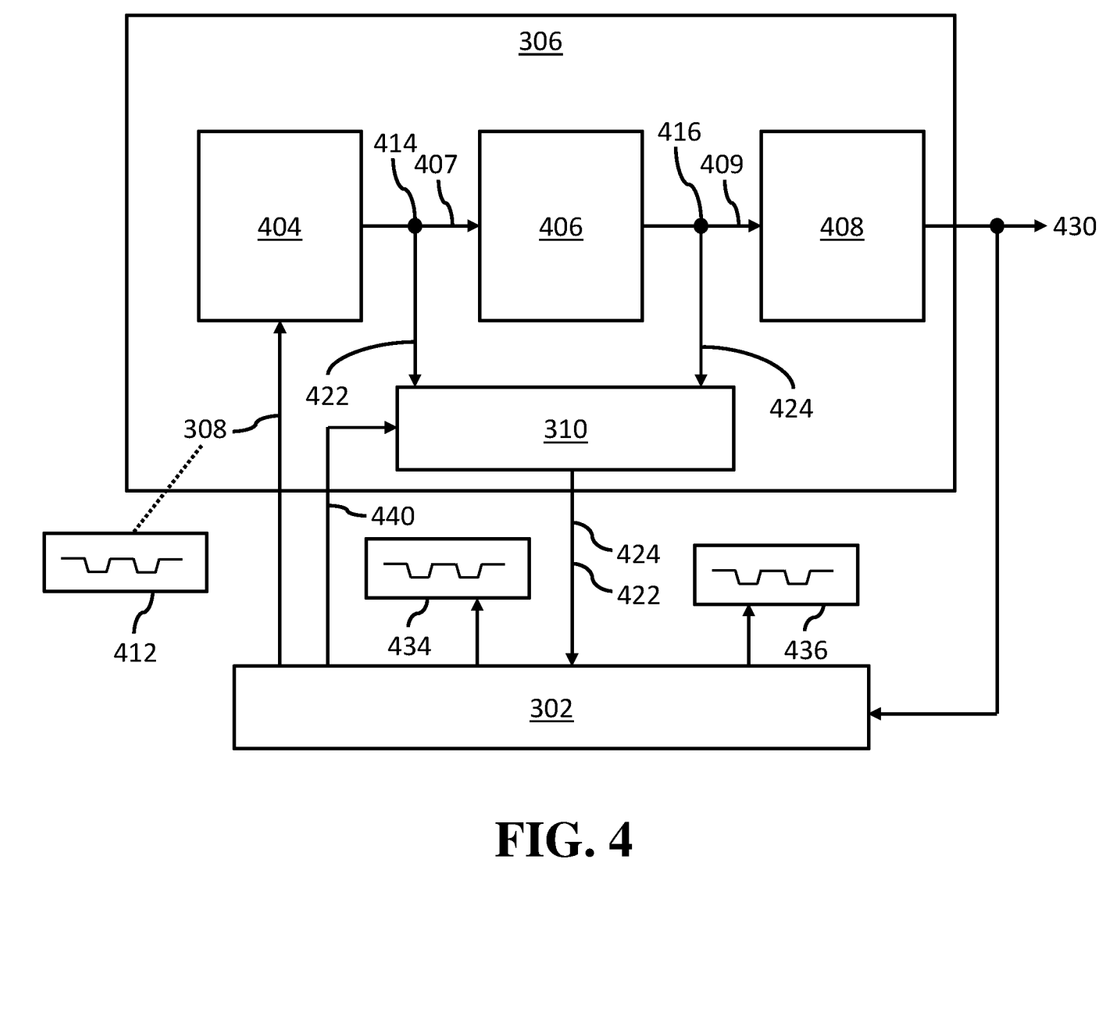
FIG. 4 is a diagram illustrating details of a register clock driver with a chip select loopback circuit according to an embodiment of the disclosure.

FIG. 4 is a diagram illustrating details of the example register clock driver (RCD) 306 of FIG. 3 according to an embodiment of the disclosure. In the example shown in FIG. 4, the RCD 306 can include the loopback circuit 310, a receiver 404, a logic circuit 406, and an output driver 408. The receiver 404 can be configured to receive the input signals 308 (see FIG. 3) from the host device 302. In one embodiment, the receiver 404 can include hardware or circuit components such as buffers and amplifiers. The input signals 308 can pass through these components in the receiver 404, and can be outputted as intermediate signals 407. In an aspect, the intermediate signals 407 can deviate from an expected output from the receiver 404 due to variations such as process and temperature variations of the components in the receiver 404. The receiver 404 can buffer and send the intermediate signals 407 to the logic circuit 406.

The logic circuit 406 can be configured to decode the intermediate signals 407 to generate another set of intermediate signals 409, and send the intermediate signals 409 to the output driver 408. In an embodiment, the input signals 308 can include a chip select signal 412 for selecting one or more memory ranks in the memory module 304 (see FIG. 3). The intermediate signals 407 can include a processed version (e.g., buffered, amplified, etc.) of the chip select signal 412. The logic circuit 406 can decode the intermediate signal 407 including the processed chip select signal 412 and generate intermediate signals 409 that represent voltages that can be applied to the memory module 304 for activating the selected memory ranks. The logic circuit 406 can send the intermediate signals 409 to the output driver 408. The output driver 408 can output a voltage 430 to activate the memory ranks being selected in the chip select signal 412.

The loopback circuit 310 can be configured to sample the chip select signal 412 at different sampling points inside the RCD 306. For example, the loopback circuit 310 can sample the chip select signal 412 by obtaining a copy of the intermediate signal 407, labeled as sampled signal 422, from a sampling point 414 between the receiver 404 and the logic circuit 406. The loopback circuit 310 can also sample the chip select signal 412 by obtaining a copy of the intermediate signal 409, labeled as sampled signal 424, from another sampling point 416 between the logic circuit 406 and the output driver 408. The loopback circuit 310 can send the sampled signals 422, 424 to the host device 302.

In an embodiment, the host device 302 can store a copy of the chip select signal 412. The host device 302 can compare the chip select signal 412 with the sampled signals 422, 424, to determine differences among the chip select signal 412 and the sampled signal 422, 424. In one embodiment, the host device 302 can simulate operations of the receiver 404 and the logic circuit 406. The simulations can result in generation of simulated signals 434, 436, that may be simulated version of the intermediate signals 407, 409, respectively. The host device 302 can compare the intermediate signal 407 with the simulated signals 434 to identify if there are differences between the intermediate signal 407 with the simulated signals 434. If a difference between the intermediate signal 407 and the simulated signals 434 exceeds a predefined difference (that may be stored in the host device 302), the host device 302 can determine that there may be errors in the receiver 404. The host device 302 can generate a flag and output the flag on, for example, a user interface in a display connected to the host device 302 to notify a user that there may be errors in the receiver 404 and/or to indicate that the receiver 404 may need to be reconfigured to maintain signal integrity of the chip select signal 412 and/or future chip select signals.

If a difference between the intermediate signal 409 and the simulated signals 436 exceeds a predefined difference (that may be stored in the host device 302), the host device 302 can determine that there may be errors in the logic circuit 406. The host device 302 can generate a flag and output the flag on, for example, a user interface in a display connected to the host device 302 to notify a user that there may be errors in the logic circuit 406 and/or to indicate that the logic circuit 406 may need to be reconfigured to maintain signal integrity of the chip select signal 412 and/or future chip select signals.

In one embodiment, the host device 302 may sample the voltage 430 at the output of the RCD 306. The host device 302 may simulate the voltage 430, and compare the sampled voltage with the simulated voltage. If there are no differences between the intermediate signals 407, 409 and the simulated signals 434, 436, or if the differences do not exceed predefined differences stored in the host device 302, but there is a difference between the sampled and simulated versions of the voltage 430, then the host device 302 can determine that there may be errors in the output driver 408 and the output driver 408 may need to be reconfigured to maintain signal integrity of the chip select signal 412 and/or future chip select signals.

In one embodiment, if there is no difference between the intermediate signal 407 and the simulated signals 434, or if the difference between the intermediate signal 407 and the simulated signals 434 does not exceed the predefined difference stored in the host device 302, but there is a difference between the intermediate signal 409 and the simulated signals 436, then the host device 302 can determine that there may be errors in the logic circuit 406, but not in the receiver 404.

In one embodiment, if there is no difference between the intermediate signal 409 and the simulated signals 436, or if the difference between the intermediate signal 409 and the simulated signals 436 does not exceed the predefined difference stored in the host device 302, but there is a difference between the intermediate signal 407 and the simulated signals 434, then the host device 302 can determine that there may be errors in the receiver 404, but not in the logic circuit 406.

Further, in one embodiment, the host device 302 can send an enable signal 440 to the loopback circuit 310 to enable or disable the loopback circuit 310. The enable signal 440 can be, for example, a binary signal such that a binary zero can disable the loopback circuit 310 and a binary one can enable the loopback circuit 310 (or vice versa). In response to disabling the loopback circuit 310, the RCD 306 can operate in a normal or pass-through mode where the RCD can buffer and decode the input signals 308 for controlling, reading, and/or writing to the memory ranks of the memory module 304. Note that when the loopback circuit 310 is disabled, the connections between the sampling point 414 and the loopback circuit 310, and between the sampling point 416 and the loopback circuit 310, can be opened or disconnected such that signals are not being sampled from the samplings points 414, 416. In response to enabling the loopback circuit 310, the connections between the sampling point 414 and the loopback circuit 310, and between the sampling point 416 and the loopback circuit 310, can be closed or connected such that the loopback circuit 310 can sample signals from the sampling points 414, 416. In one embodiment, the pass-through mode and the loopback mode can be activated simultaneously such that the loopback circuit 310 can sample signals during normal operations of the RCD 306.

By integrating the loopback circuit 310 in the RCD 306, one or more test points can be inserted in the RCD 306 to maintain signal integrity. For example, chip select signals can be sampled from more than one sampling points inside the RCD 306 as shown in FIG. 4. The different sampling points in the RCD 306 can provide information on which specific parts or stages of the RCD 306 may have errors and may need attention. Further, the integration of the loopback circuit 310 allows dedicated ports of the RCD 306 to be assigned to the sampling points (e.g., 414, 416), such that testing can be performed periodically to improve and maintain signal integrity during normal operations.

Figure 5:
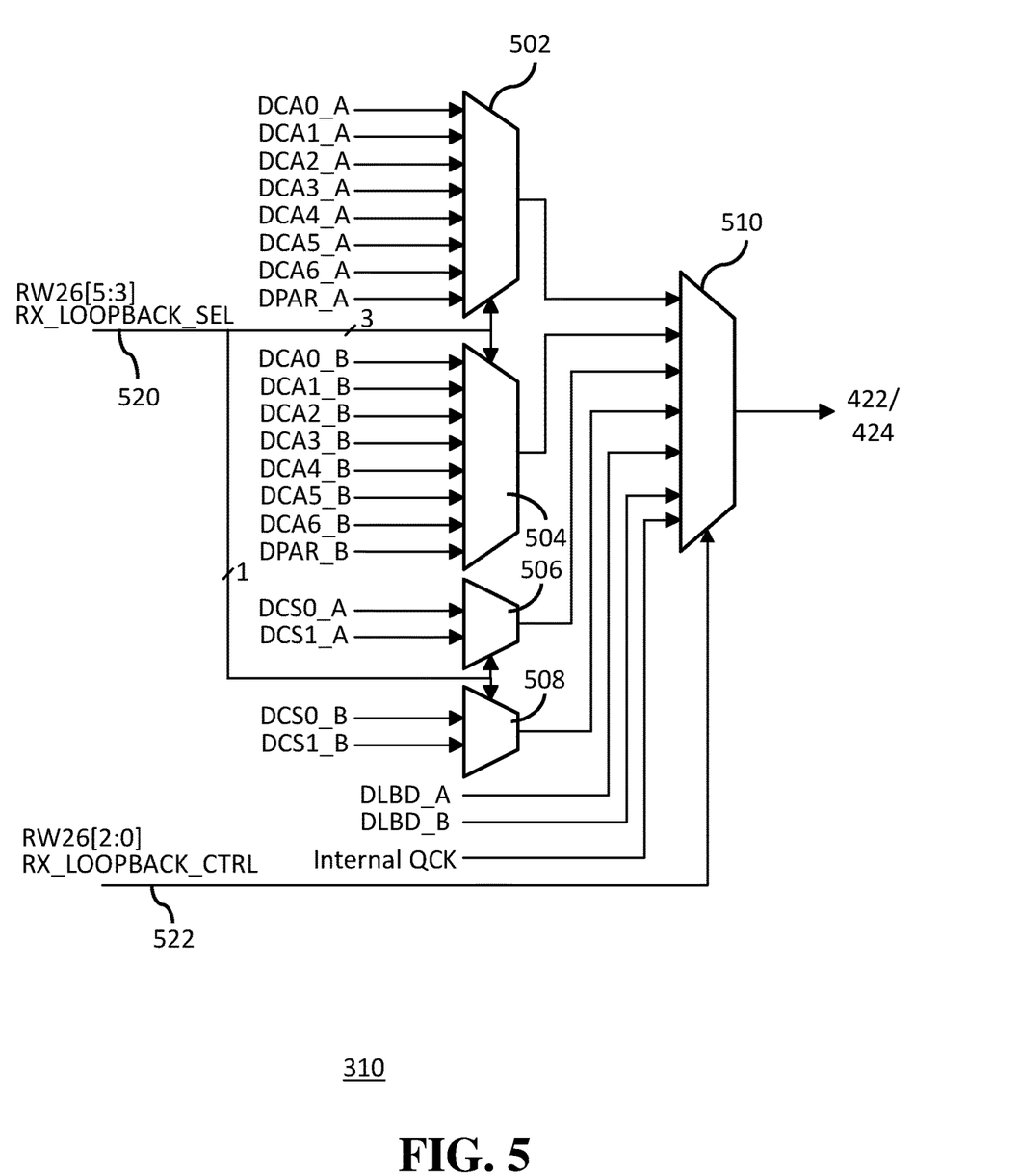
FIG. 5 is a circuit diagram of a loopback circuit according to an embodiment of the disclosure.

FIG. 5 is a circuit diagram of the loopback circuit 310 according to an embodiment of the disclosure. The loopback circuit 310 can include a plurality of circuit components to facilitate sampling and selection of sampled signals that can be fed back to the host device 302 (see FIG. 4). In the example shown in FIG. 5, the loopback circuit 310 can include a plurality of multiplexers 502, 504, 506, 508, and 510. The multiplexer 502 can be configured to receive a plurality of command/address signals (DCA0_A to DCA6_A), and a parity signal or parity bit (DPAR_A) sampled from one or more sampling points in the RCD 306 (see FIG. 3, FIG. 4). The sampled signals DPAR_A and DCA0_A to DCA6_A can correspond to a first channel of the memory module 304 and the RCD 306 ("Channel A"). The multiplexer 504 can be configured to receive a plurality of command/address signals (DCA0_B to DCA6_B), and a parity signal or parity bit (DPAR_B) sampled from one or more sampling points in the RCD 306. The sampled signals DPAR_B and DCA0_B to DCA6_B can correspond to a second channel of the memory module 304 and the RCD 306 ("Channel B"). A select signal 520, labeled as RX_LOOPBACK_SEL, can be provided by the RCD 306 and/or the host device 302 (see FIG. 3, FIG. 4) for selecting one of the sampled signals received by the multiplexers 502, 504, to be outputted to the multiplexer 510. In one embodiment, the select signal 520 can be a three-bit signal having a first bit, a second bit, and a third bit.

The multiplexer 506 can be configured to receive sampled chip select signals (DCS0_A) from a sampling point in the RCD 306, where the sampled chip select signal DCS0_A corresponds to Channel A. The multiplexer 508 can be configured to receive sampled chip select signals (DCS0_B) from a sampling point in the RCD 306, where the sampled chip select signal DCS0_B corresponds to Channel B. The sampled chip select signals received by the multiplexers 502, 504 can be one or more of the signals sampled from sampling points 414, 416, shown in FIG. 4. In one embodiment, one of the bits in the select signal 520 can be used for selecting one of the input sampled signals received by the multiplexers 506, 508, to be outputted to the multiplexer 510.

The multiplexer 510 can be configured to receive outputs from the multiplexers 502, 504, 506, 508. The multiplexer 510 can also receive sampled external signals such as DLBD_A and DLBD_B that may be sampled externally, such as at sampling points outside of the RCD 306, between the RCD306 and the host device 302, and/or between the RCD 306 and the memory ranks of the memory module 304 (see FIG. 3). The multiplexer 510 can also receive sampled clock signals that may be internal or external to the RCD 306 (e.g., an internal clock signal labeled as Internal QCK in FIG. 5). A select signal 522, labeled as RX_LOOPBACK_CTRL, can be provided by the RCD 306 and/or the host device 302 for selecting one of the sampled signals received by the multiplexer 510 to be outputted as sampled signals 422, 424 shown in FIG. 4. In one embodiment, the select signal 522 can be a three-bit signal having a first bit, a second bit, and a third bit.

In one embodiment, the select signal 522 can control the selection of the sampled chip select signals to be outputted by the multiplexer 510. For example, the third bit (or the least significant bit) in the select signal 520 can be used for selecting the sampled signals in the multiplexers 506, 508. As such, the select signal 520 being '000', '010', '100', '110' can cause a binary '0' to be transmitted to the selection pins of the multiplexers 506, 508. In an example, the select signal 520 being '000' can cause the multiplexer 502 to select DCA0_A, the multiplexer 504 to DCA0_B, and the binary '0' causes the multiplexers 506, 508 to select the chip select signals DCS0_A and DCS0_B, respectively. Therefore, the select signal 520 being '000' can cause the multiplexers 502, 504, 506, 508 to output DCA0_A, DCA0_B, DCS0_A, DCS0_B, respectively. The select signal 522 can select one of the outputs DCA0_A, DCA0_B, DCS0_A, DCS0_B, such that even though the third bit of select signal 520 is shared by multiple multiplexers, the multiplexer 510 can output a desired sampled signal. By utilizing existing bits in select signals for other sampled internal signals, the loopback circuit 310 can provide sampling of chip select signals internally without having to design and assign new control word bits for chip select sampling and loopback.

In one embodiment, the multiplexers 502, 504, 506, 508, 510 can be considered as one group of loopback block within the loopback circuit 310. The loopback circuit 310 can include more than one loopback block identical to the example shown in FIG. 5 that may receive different types of sampled signals to be fed back to the host device 302. For example, the multiplexers 502, 504, 506, 508, 510 shown in FIG. 5 can be configured for sampling the command/address signals, parity signals, chip select signals from inside the RCD 306 and external data signals DLBD_A and DLBD_B.

The loopback circuit 310 can include another loopback block having a similar arrangement of multiplexers 502, 504, 506, 508, 510 that can be configured for sampling the command/address signals, parity signals, chip select signals from inside the RCD 306 and external clock signals (e.g., instead of DLBD_A and DLBD_B, the multiplexer 510 may receive external clock signals).

Figure 6:
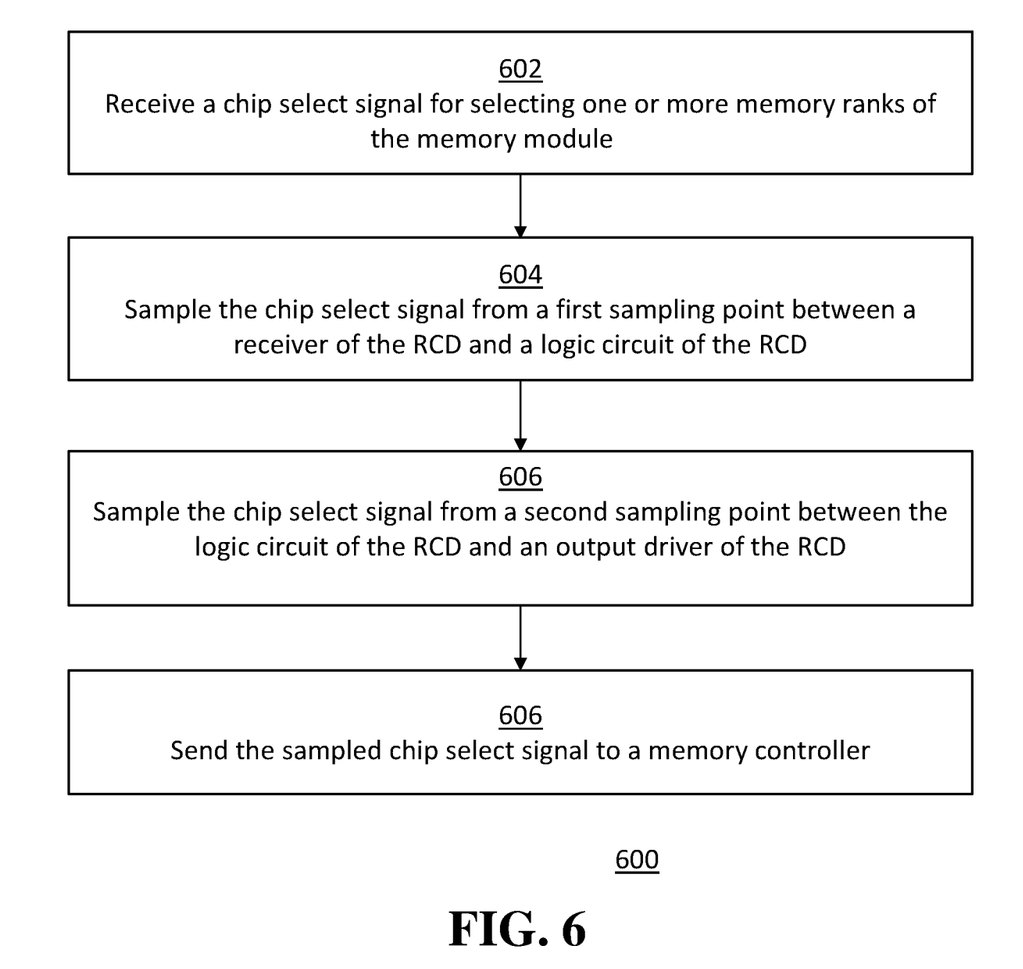
FIG. 6 is a flowchart of an example process 600 that may implement a register clock driver with chip select loopback according to an embodiment of the disclosure.

FIG. 6 is a flowchart of an example process 600 that may implement a register clock driver with a chip select loopback circuit according to an embodiment of the disclosure. The process 600 can include one or more operations, actions, or functions as illustrated by one or more of blocks 602, 604, and/or 606. Although illustrated as discrete blocks, various blocks can be divided into additional blocks, combined into fewer blocks, eliminated, in different order, or performed in parallel, depending on the desired implementation.

The process 600 can be implemented by a register clock driver (RCD) of a memory module. The process 600 can being at block 602. At block 602, the RCD can receive a chip select signal for selecting one or more memory ranks of the memory module. In one embodiment, the memory module can be a DDR5 load-reduction dual in-line memory module (LRDIMM) including synchronous dynamic random-access memory (SDRAM) devices.

The process 600 can proceed from block 602 to block 604. At block 604, the RCD can sample the chip select signal from a first sampling point between a receiver of the RCD and a logic circuit of the RCD. The process 600 can proceed from block 604 to block 606. At block 606, the RCD can sample the chip select signal from a second sampling point between the logic circuit of the RCD and an output driver of the RCD. The process 600 can proceed from block 606 to block 608. At block 608, the RCD can send the sampled chip select signals to a memory controller. In one embodiment, the RCD may perform the operations in one of block 604 and block 606. In another embodiment, the RCD may perform operations in both blocks 604, 606, individually or simultaneously.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A memory module comprising:
a register clock driver comprising:
  a loopback circuit configured to receive:
    one or more command/address signals;
    one or more parity signals;
    one or more sampled chip select signals sampled at one or more sampling points inside a register clock driver;
    one or more sampled external signals sampled at one or more sampling points outside of the register clock driver;
    one or more sampled clock signals sampled at one or more sampling points inside or outside the register clock driver;
  a first select signal configured to select signals from the one or more command/address signals, the one or more parity signals, and the one or more sampled chip select signals; and
  a second select signal configured to:
    select a signal from the one or more sampled external signals, the one or more sampled clock signals, the one or more command/address signals selected by the first select signal, and the one or more sampled chip select signals selected by the first select signal; and
    configured to decide an output signal to a host device based on the first select signal and the second select signal.

2. The memory module according to claim 1, wherein:
the one or more sampled external signals are sampled between the register clock driver and the host device; and/or
the one or more sampled external signals are sampled between the register clock driver and memory ranks of the memory module.

3. The memory module according to claim 1, wherein:
the first select signal comprises:
  a first portion corresponding to a first channel of the memory module and the register clock driver, and
  a second portion corresponding to a second channel of the memory module and the register clock driver; and
the second select signal comprises:
  a first portion corresponding to a first channel of the memory module and the register clock driver, and
  a second portion corresponding to a second channel of the memory module and the register clock driver.

4. The memory module according to claim 1, wherein:
the first select signal comprises a three-bit signal comprising three bits, and
one of the three bits among the three-bit signal is used for both selecting a sampled chip select signal and a sampled command/address signal.

5. The memory module according to claim 1, wherein the loopback circuit is enabled when an enable signal is received.

* * * * *